(12) United States Patent
Monro (10) Patent No.: US 7,770,091 B2
(45) Date of Patent: Aug. 3, 2010

(54) DATA COMPRESSION FOR USE IN COMMUNICATION SYSTEMS

(76) Inventor: Donald M. Monro, 6, The Lays, Goose Street, Beckington, Somerset, BA11 6RS (GB)

( * ) Notice: Subject to any disclaimer, the term of this patent is extended or adjusted under 35 U.S.C. 154(b) by 802 days.

(21) Appl. No.: 11/425,137

(22) Filed: Jun. 19, 2006

(65) Prior Publication Data

US 2008/0005648 A1 Jan. 3, 2008

(51) Int. Cl.
*H03M 13/00* (2006.01)
(52) U.S. Cl. .................... 714/780; 341/51
(58) Field of Classification Search ............ 314/51; 341/87, 51; 375/240; 709/347; 714/784, 714/780

See application file for complete search history.

(56) References Cited

U.S. PATENT DOCUMENTS

| | | | |
|---|---|---|---|
| 4,168,513 A | 9/1979 | Hains et al. | |
| 4,509,038 A | 4/1985 | Hirano | |
| 4,558,302 A * | 12/1985 | Welch | 341/51 |
| 4,675,809 A | 6/1987 | Omoda et al. | |
| 4,908,873 A | 3/1990 | Philbert et al. | |
| 5,218,435 A | 6/1993 | Lim et al. | |
| 5,315,670 A | 5/1994 | Shapiro | |
| 5,321,776 A | 6/1994 | Shapiro | |
| 5,412,741 A | 5/1995 | Shapiro | |
| 5,559,931 A | 9/1996 | Shindou et al. | |
| 5,635,932 A * | 6/1997 | Shinagawa et al. | 341/51 |
| 5,699,121 A | 12/1997 | Zakhor et al. | |
| 5,748,786 A | 5/1998 | Zandi et al. | |
| 5,754,704 A | 5/1998 | Barnsley et al. | |
| 5,768,437 A | 6/1998 | Monro et al. | |
| 5,819,017 A | 10/1998 | Akeley et al. | |
| 5,873,076 A | 2/1999 | Barr et al. | |
| 5,956,429 A | 9/1999 | Burns | |
| 6,029,167 A | 2/2000 | Evans | |
| 6,037,883 A | 3/2000 | Forbes | |
| 6,052,416 A | 4/2000 | Koga | |
| 6,078,619 A | 6/2000 | Monro et al. | |
| 6,086,706 A | 7/2000 | Brassil et al. | |

(Continued)

FOREIGN PATENT DOCUMENTS

EP 0 595 599 A2 5/1994

(Continued)

OTHER PUBLICATIONS

Choog Soo Park et al., "Lost Motion Vector Recovery Algorithm," Circuits and Systems, IEEE International Symposium on London, vol. 3, 1994, pp. 229-232.

(Continued)

*Primary Examiner*—David Ton
(74) *Attorney, Agent, or Firm*—Sterne, Kessler, Goldstein & Fox P.L.L.C.

(57) ABSTRACT

Techniques for data compression are provided. A data compression technique may include selecting a symbol string, being one or more characters, that occurs within a data set, generating a symbol string code corresponding to respective positions of the symbol string within the data set, successively repeating the above procedure for any additional symbol strings that occur within the data set to produce any additional respective symbol string codes, and generating a compressed data code through combining the respective symbol string codes.

28 Claims, 2 Drawing Sheets

U.S. PATENT DOCUMENTS

| | | | |
|---|---|---|---|
| 6,125,348 A | 9/2000 | Levine | |
| 6,144,835 A | 11/2000 | Inoue | |
| 6,208,744 B1 | 3/2001 | Ishige et al. | |
| 6,336,050 B1 | 1/2002 | Amin et al. | |
| 6,434,542 B1 | 8/2002 | Farmen et al. | |
| 6,480,547 B1 | 11/2002 | Chen et al. | |
| 6,489,902 B2 * | 12/2002 | Heath | 341/87 |
| 6,549,148 B2 * | 4/2003 | Satoh | 341/51 |
| 6,556,719 B1 | 4/2003 | Monro | |
| 6,563,438 B2 * | 5/2003 | Satoh | 341/51 |
| 6,625,213 B2 | 9/2003 | Bottreau et al. | |
| 6,654,503 B1 | 11/2003 | Sudharsanan et al. | |
| 6,661,839 B1 * | 12/2003 | Ishida et al. | 375/240 |
| 6,707,400 B2 | 3/2004 | Christofferson et al. | |
| 6,714,147 B2 | 3/2004 | Huber et al. | |
| 6,820,079 B1 | 11/2004 | Evans | |
| 6,847,966 B1 | 1/2005 | Sommer et al. | |
| 6,985,965 B2 * | 1/2006 | Hannu et al. | 709/247 |
| 6,990,145 B2 | 1/2006 | Monro et al. | |
| 7,003,039 B2 | 2/2006 | Zakhor et al. | |
| 7,079,986 B2 | 7/2006 | Sieracki | |
| 7,230,551 B2 | 6/2007 | Moriya et al. | |
| 7,310,055 B2 | 12/2007 | Odagiri | |
| 7,352,298 B2 | 4/2008 | Monro | |
| 2002/0069206 A1 | 6/2002 | Bergman et al. | |
| 2003/0108101 A1 | 6/2003 | Frossard et al. | |
| 2004/0028135 A1 | 2/2004 | Monro | |
| 2004/0126018 A1 | 7/2004 | Monro | |
| 2004/0165737 A1 | 8/2004 | Monro | |
| 2004/0218836 A1 | 11/2004 | Kanatsu | |
| 2005/0149296 A1 | 7/2005 | Sieracki | |
| 2007/0016414 A1 | 1/2007 | Mehrotra et al. | |
| 2007/0030177 A1 | 2/2007 | Monro | |
| 2007/0053434 A1 | 3/2007 | Monro | |
| 2007/0053597 A1 | 3/2007 | Monro | |
| 2007/0053603 A1 | 3/2007 | Monro | |
| 2007/0164882 A1 | 7/2007 | Monro | |
| 2007/0252733 A1 | 11/2007 | Thebault et al. | |
| 2007/0258654 A1 | 11/2007 | Monro | |
| 2007/0271250 A1 | 11/2007 | Monro | |
| 2007/0290898 A1 | 12/2007 | Monro | |
| 2007/0290899 A1 | 12/2007 | Monro | |
| 2008/0055120 A1 | 3/2008 | Monro | |
| 2008/0056346 A1 | 3/2008 | Monro | |
| 2008/0084924 A1 | 4/2008 | Monro | |
| 2008/0086519 A1 | 4/2008 | Monro | |

FOREIGN PATENT DOCUMENTS

| | | |
|---|---|---|
| EP | 0 836 325 A1 | 4/1998 |
| EP | 1 545 010 A1 | 6/2005 |
| EP | 1 610 560 A | 12/2005 |
| GB | 2 293 733 A | 4/1996 |
| GB | 2 409 943 A | 7/2005 |
| WO | WO97/16029 | 5/1997 |
| WO | WO98/11730 | 3/1998 |
| WO | WO99/08449 | 2/1999 |
| WO | WO01/15456 | 3/2001 |
| WO | WO01/63935 | 8/2001 |
| WO | WO02/13538 | 2/2002 |
| WO | WO2004/051863 | 6/2004 |
| WO | WO2005/027049 | 3/2005 |
| WO | WO 2005/064799 | 7/2005 |
| WO | WO 2005/067661 | 7/2005 |
| WO | WO2005/119581 | 12/2005 |
| WO | WO2007/030702 | 3/2007 |
| WO | WO2007/030784 | 3/2007 |
| WO | WO2007/030785 | 3/2007 |
| WO | WO2007/030788 | 3/2007 |
| WO | WO 2007/084336 | 7/2007 |
| WO | WO 2007/118220 | 10/2007 |
| WO | WO 2007/145875 | 12/2007 |
| WO | WO 2007/149358 | 12/2007 |
| WO | WO 2007/149383 | 12/2007 |
| WO | WO 2007/149384 | 12/2007 |
| WO | WO 2008/027450 | 3/2008 |
| WO | WO 2008/030426 | 3/2008 |
| WO | WO/2008/045280 | 4/2008 |
| WO | WO/2008/045281 | 4/2008 |

OTHER PUBLICATIONS

International Search Report for Appln. No. PCT/US2008/002179, issued Aug. 20, 2008, 12 pgs.

Non-Final Office Action for U.S. Appl. No. 11/255,090, dated Dec. 15, 2008, 11 pgs.

International Search Report and Written Opinion for Appln. No. PCT/US2008/002101, dated Dec. 12, 2008, 13 pgs.

Cotter et al., "Application of Tree-Based Searches to Matching Pursuit," 2001 IEEE International Conference on Acoustics, Speech and Signal Processing, New York, NY, vol. 6, 7, May 2001, pp. 3933-3936.

Shoa et al., "Tree Structure Search for Matching Pursuit," Image Processing, 2005, vol. 3, 11, pp. 908-911.

Qiangsheng Liu et al., "A low-cost video encoder with matching pursuit," Intelligent Multimedia, Video and Speech Processing, May 2, 2001, pp. 502-505.

Yuan Yuan et al., "Improved Matching Pursuits Image Coding," Acoustics, Speech, and Signal Processing, 2005, vol. 2, 18, pp. 201-204.

International Search Report and Written Opinion for Appln. No. PCT/US2008/002100, dated Dec. 12, 2008, 14 pgs.

International Search Report for Appln. No. PCT/US2007/021302, dated Dec. 10, 2008, 5 pgs.

Haoxing Zhang et al., "A Hybrid Video Coder Based on H.264 with Matching Pursuits," Acoustics, Speech and Signal Processing, 2006, p. 889.

Yuan et al., "3D Wavelet Video Coding with Replicated Matching Pursuits," Sep. 11, 2005, Image Processing, pp. 69-72.

Monro et al., "Subband Adaptive Dictionaries for Wavelet/Matching Pursuits Image Coding," Oct. 8, 2006, Image Processing, p. 2136.

Chien-Kai et al., "Matching Pursuits Low Bit Rate Video Coding with Codebooks Adaptation," Jun. 5, 2000, Acoustics, Speech, and Signal Processing, pp. 408-411.

International Search Report for Appln. No. PCT/US2007/021303, dated Dec. 12, 2008, 5 pgs.

Rabiee et al., "Scalable Subband Image Coding with Segmented Orthogonal Matching Pursuit," Oct. 4, 1998, Image Processing, pp. 774-777.

Rabiee et al., "Low-bit-rate Subband Image Coding with Matching Pursuits," Visual Communications and Image Processing, vol. 3309, 1998, pp. 875-880.

Schmid-Saugeon et al., "Dictionary Design for Matching Pursuit and Application to Motion-Compensated Video Coding," 2004, IEEE Transactions on Circuits and Systems for Video Technology, pp. 880-886.

International Search Report for Appln. No. PCT/US2007/019297, dated Dec. 12, 2008, 5 pgs.

Non-Final Office Action for U.S. Appl. No. 11/422,316, mailed Dec. 4, 2008, 13 pgs.

Non-Final Office Action for U.S. Appl. No. 11/255,090, mailed Dec. 15, 2008, 15 pgs.

Non-Final Office Action for U.S. Appl. No. 11/332,777, mailed Feb. 25, 2009, 6 pgs.

Final Office Action for U.S. Appl. No. 11/425,142, mailed Mar. 2, 2009, 18 pgs.

International Search Report for Appln. No. PCT/US2007/014181 issued Jan. 23, 2008, 1 pg.

David Salomon, "Data Compression: The Complete Reference," 1998, Springer, XP002464409, pp. 32-33.

Non-Final Office Action for U.S. Appl. No. 11/677,511, mailed Feb. 20, 2009, 23 pgs.

Non-Final Office Action for U.S. Appl. No. 11/677,515, mailed Feb. 25, 2009, 21 pgs.

Brin et al., Copy detection mechanisms for digital documents, Proceedings of the 1995 ACM SIGMOD international conference on Management of data SIGMOD '95, Volumer 24 ACM Press, May 1995, pp. 398-409.

Cancedda et al., Word Sequence Kernels, Mar. 2003, MIT Press, Journal of Machine Learning Research, vol. 3 Special Edition, pp. 1059-1082.

Cover et al. "Elements of Information Theory" Copyright Jon Wiley & Sons, Inc., p. 96, 1991.

Czerepinski et al., "Matching Pursuits Video Coding: Dictionaries and Fast Implementation" IEEE Trans Circuit Systems Video Technology, vol. 10, No. 7, pp. 1103-1115, Oct. 2000.

Daubechies, "Orthonormal Bases of Compactly Supported Wavelets" Comm. Pure Appl. Math., vol. 41 pp. 909-996, 1998.

De Natale, et al., "A Mesh-Interpolation Scheme for Very-Low Bitrate Coding of Video Sequences" European Transactions on Telecommunications, vol. 9, No. 1, pp. 47-55, 1998.

De Vleeschouwer et al., "Subband dictionaries for low-cost matching pursuits of video residues," IEEE Transactions on Circuits and Systems for Video Technology, vol. 9, Issue 7, pp. 984-993, Oct. 1999.

Figueras et al., "Color Image Scalable Coding with Matching Pursuit" IEEE Int. Conference Acoustics Speech Signal Process, pp. III-53-56, May 2004.

Frossard et al., "High Flexibility Scalable Image Coding" Proceedings of VCIP 2003, Jul. 2003.

Gamito et al. "Lossles Coding of Floating Point Data with JPEG 2000 Part 10" Proceedings of the SPIE, SPIE, Bellingham, VA, US. vol. 5558, Aug. 2, 2004. pp. 276-287.

Golomb, S.W., "Run-length encodings" IEEE Trans Info Theory, Jul. 1966, 12(3):399-401.

Horst et al. " Mupcos: A multi-purpose coding scheme" Signal Processing: Image Communication 5, pp. 75-89, 1993.

Hosang, M., "A Character Elimination Algorithm for Lossless Data Compression" Data Compression Conference, Proceedings. DCC, IEEE Computer Society Press, Los Alamitos, CA, US, Apr. 2, 2002, pp. 1-10.

Huffman, David A., "A Method for the Construction of Minimum-Redundancy Codes," Pro. Inst. Radio Eng., 1952, 9 (40), pp. 1098-1101.

Hull, Jonathan J., "Document Image Matching and Retrieval with Multiple Distortion-Invariant Descriptors", International Association for Pattern Recognition Workshop on Document Analysis Systems, Series in Machine Perception and Artificial Intelligence, vol. 14, published by World Scientific Publishing Co. Pte. Ltd. 1995, pp. 379-396.

Jun-peng Bao et al., "A new text feature extraction model and its application in document copy detection" Machine Learning and Cybernetics, 2003, International Conference on Nov. 2-5, 2003 Piscataway, NJ, USA, IEEE, vol. 1, Nov. 2, 2003, pp. 82-87.

Larsson, N.J., "The Context Trees of Block Sorting Compression" In Proceedings of the IEEE Data Compression Conference, Snowbird, Utah, Mar. 30-Apr. 1, pp. 189-198. IEEE Computer Society Press, 1998.

Mallat et al., "Matching Pursuits with Time-Frequency Dictionaries" IEEE Trans. Signal Processing, vol. 41. No. 12, pp. 3397-3415, Dec. 1993.

Mallat, "A Theory for Multiresolution Signal Decomposition: The Wavelet Representation" IEEE Trans. Pattern Anal. Mach. Intel., vol. 11, No. 7, Jul. 1989.

Monro et al., "Alignment Blur in Coherently Averaged Images" IEEE Transactions on Signal Processing, vol. 4, No. 6, pp. 1596-1601, Jun. 1996.

Monro et al., "Bases for Low Complexity Matching Pursuits Image Coding" Dept. of Electron. & Electr. Eng., Bath Univ., UK, 2005 .IEEE International Conference on Image Processing, Publication Date: Sep. 11-14, 2005. vol. 2, pp. 249-252.

Monro et al., "Improved Coding of Atoms in Matching Pursuits" IEEE Int. Conference. Image Processing, vol. 2, Sep. 2003.

Monro et al., "Visual Embedding of Wavelet Transformation Coefficients" IEEE International Conference Image Process, pp. 186-189, Sep. 2000.

Monro, "Basis Picking for Matching Pursuits Image Coding" IEEE International Conference on Image Processing, pp. 2495-2498, Sep. 2004.

Moschetti et al., "New Dictionary and Fast Atom Searching Method for Matching Pursuit Representation of Displaced Frame Difference" IEEE International Conference on Image Processing, pp. II-685-688, Sep. 2002.

Neff et al., "Matching Pursuit Video Coding-Part I: Dictionary Approximation" IEEE Trans. Circuits System Video Technology, vol. 12, No. 1, pp. 13-26, Jan. 2002.

Neff et al., "Very Low Bit-Rate Video Coding Based on Matching Pursuits" IEEE Trans. Circuits and Systems for Video Tech., vol. 7, No. 1, pp. 158-171, Feb. 1997.

Poh et al., "Comparison of Residual Compression Methods in Motion Compensated Video" IEEE Int. Workshop on Multimedia Signal Processing, pp. 109-112, Dec. 2002.

R. F. Rice, "Some Practical Universal Noiseless Coding Techniques," Jet Propulsion Laboratory, Pasadena, California, JPL Publication 79—22, Mar. 1979.

Ramchandran et al., "Best Wavelet Packet Bases in a Rate-Distortion Sense" IEEE Transactions on Signal Processing, vol. 2, No. 2, pp. 160-175, Apr. 1993.

Said et al., "A New, Fast, and Efficient Image Codec Based on Set Partitioning in Heirarchical Trees" IEEE Transactions on Circuits and Systems for Video Technology, vol. 6, No. 3, pp. 243-250, Jun. 1996.

Sayood, Khalid, "Introduction to Data Compression" Morgan Kaufmann Publishers Inc., San Francisco, CA, USA 1996, pp. 27-32.

Sayood, Khalid, "Introduction to Data Compression" Morgan Kaufmann Publishers Inc., San Francisco, CA, USA 1991, pp. 98-99.

Salomon, "Data Compression: the complete reference", Springer, pp. 32-33, 1998.

Schleimer et al., Data security protection: Winnowing: local algorithms for document fingerprinting, 2003 ACM SIGMOD international conference on Management of data (SIGMOD '03), ACM Press, Jun. 2003, pp. 76-85.

Shapiro, "Embedded Image Coding Using Zerotrees of Wavelet Coefficients" IEEE Transactions on Signal Processing, vol. 41, No. 12, pp. 3445-3462, Dec. 1993.

Steffen et al., "Theory of Regular M-band Wavelets Bases" IEEE Transactions on Signal Processing, vol. 41. No. 12, pp. 3497-3511, Dec. 1993.

Teuhola, J. "A Compression Method for Clustered Bit-Vectors" Information Processing Letters, Amsterdam, NL, vol. 7, No. 6, pp. 308-311, Oct. 1978.

Tian et al., "Image Data Processing in the Compressed Wavelet Domain" Proceedings of ICSP'96, pp. 978-981, 1996.

Tredwell et al., "A Sequential Vector Selection Algorithm for Controllable Bandwidth Motion Description Encoding" IEEE Sympos. Intell. Multimedia. Video & Speech Process, May 2001.

Trott et al. "Wavelets Applied to Lossless Compression and Progressive Transmission of Floating Point Data in 3-D Curvilinear Grids" IEEE Proceedings of the Visualization Conference, Oct. 27, 1996, pp. 385-388.

Yuan et al., "Improved Matching Pursuits Image Coding" IEEE International Conference on Acoustics, Speech and Signal Processing ICASSP 2005, pp. II-201-204, Mar. 2005.

Yuan et al., "Low Complexity Separable Matching Pursuits" IEEE Int. Conference Acoustics Speech Signal Process, pp. III-725-728, May 2004.

Donald Monro, U.S. Appl. No. 11/677,515, filed Feb. 21, 2007, entitled "Hierarchical Update Scheme for Extremum Location with Indirect Addressing".

Donald Monro, U.S. Appl. No. 11/678,004, filed Feb. 22, 2007, entitled, "Video Coding With Motion Vectors Determined by Decoder".

Donald Monro, U.S. Appl. No. 11/678,479, filed Feb. 23, 2007, entitled, "Video Coding With Embedded Motion".

Donald Monro, U.S. Appl. No. 11/777,256, filed Jul. 11, 2007.

Donald Monro, U.S. Appl. No. 11/677,511, filed Feb. 21, 2007, entitled "Hierarchical Update Scheme for Extremum Location".

Donald Monro, U.S. Appl. No. 11/777,239, filed Jul. 12, 2007.

Donald Monro, U.S. Appl. No. 11/777,230, filed Jul. 12, 2007.

Donald Monro, U.S. Appl. No. 11/777,130, filed Jul. 12, 2007.
Donald Monro, U.S. Appl. No. 11/777,144, filed Jul. 12, 2007.
Donald Monro, U.S. Appl. No. 11/777,122, filed Jul. 12, 2007.
Donald Monro, U.S. Appl. No. 11/777,100, filed Jul. 12, 2007.
Donald Monro, U.S. Appl. No. 11/777,081, filed Jul. 12, 2007.
Donald Monro, U.S. Appl. No. 11/777,022, filed Jul. 12, 2007.
Donald Monro, U.S. Appl. No. 11/776,786, filed Jul. 12, 2007.
Donald Monro, PCT Serial No. PCT/US2007/008861, filed Apr. 9, 2007, entitled "Motion Assisted Data Enhancement".
Donald Monro, PCT Serial No. PCT/US2008/002100, filed Feb. 19, 2008, entitled "Hierarchical Update Scheme for Extremum Location".
Donald Monro, PCT Serial No. PCT/US2008/002101, filed Feb. 19, 2008, entitled "Hierarchical Update Scheme for Extremum Location with Indirect Addressing".
International Search Report for Appln. No. PCT/US2007/013100 issued Jan. 14, 2008, 4pgs.
International Search Report for Appln. No. PCT/US2007/000759 issued Feb. 14, 2008, 7pgs.
International Search Report for Appln. No. PCT/US2007/014138 issued Oct. 29, 2007, 2 pgs.
International Search Report for Appln. No. PCT/US2007/014182 issued Jan. 18, 2008, 1 pg.
International Search Report for Appln. No. PCT/US2007/014181 issued Jan. 14, 2008.
Non-Final Office Action for U.S. Appl. No. 11/255,090, completed Feb. 2, 2008, mailed Feb. 6, 2008, 14pgs.
Non-Final Office Action for U.S. Appl. No. 11/332,777, completed Dec. 12, 2007, mailed Dec. 21, 2007, 4pgs.
Final Office Action for U.S. Appl. No. 11/425,142, completed Sep. 10, 2007, mailed Sep. 18, 2007, 9 pgs.
Non-Final Office Action for U.S. Appl. No. 11/425,142, completed Mar. 7, 2007, mailed Mar. 20, 2007, 8 pgs.
Non-Final Office Action for U.S. Appl. No. 11/470,611, completed Aug. 29, 2007, mailed Sep. 5, 2007, 6 pgs.
Written Opinion for Appln. No. PCT/US2007/000759 completed Feb. 14, 2007, mailed Feb. 25, 2008, 11pgs.
International Search Report for Appln. No. PCT/US2007/019034 issued Apr. 8, 2008, 2pgs.
Written Opinion for Appln. No. PCT/US2007/019034 completed Mar. 31, 2008, mailed Apr. 8, 2008, 7pgs.
Non-Final Rejection for U.S. Appl. No. 11/470,611, mailed on Jun. 30, 2008, 5 pgs.
Non-Final Rejection for U.S. Appl. No. 11/422,316, mailed on Jul. 3, 2008, 7 pgs.
Final Office Action for U.S. Appl. No. 11/332,777, mailed Aug. 13, 2008, 5 pgs.
Final Office Action for U.S. Appl. No. 11/255,090, mailed Sep. 3, 2008, 11 pgs.
Non-Final Office Action for U.S. Appl. No. 11/425,142, mailed Sep. 16, 2008, 12 pgs.
Non-Final Office Action for U.S. Appl. No. 12/392,223, dated Sep. 14, 2009, 7 pgs.
Zhang et al., "A Rate Estimation Framework for Matching Pursuits Video Coding," Journal of Multimedia, pp. 36-45, 2:3, Academy Publisher, Jun. 2007.
International Search Report and Written Opinion for PCT/US2008/069535 mailed Jun. 10, 2009.
Non-Final Office Action for U.S. Appl. No. 11/777,100, dated Jul. 21, 2008, 11 pgs.
Non-Final Office Action for U.S. Appl. No. 11/777,130, dated Oct. 14, 2009, 6 pgs.

* cited by examiner

DATA COMPRESSION FOR USE IN COMMUNICATION SYSTEMS

FIELD

The present patent application is related to data compression.

BACKGROUND

In recent years it has become more and more common for persons to share data over networks; however, transmission of data has a cost in terms of bandwidth utilization. Therefore, large amounts of data, for example, are often compressed. Compression may also be used in storing data on magnetic or other media.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

Although claimed subject matter is not limited in scope in this respect, one particular embodiment of a method of compressing data is described hereinafter. A symbol string is selected that occurs within a set or grouping of data to be compressed. A symbol string code is generated indicative of one or more positions of the symbol string within the data. Likewise, for further symbol strings within the data, this may be repeated. Respective symbol string codes may then be combined to form a data code. A resulting data code is a compressed form of the set or grouping of data. This data code may be transmitted or stored as desired.

One particular embodiment may be carried out by successively identifying positions at which a selected symbol string occurs, determining distances between occurrences of the selected symbol string, and generating a code including distances representing the positions of the selected string within the data, although claimed subject matter is not limited in scope in this respect. Likewise, here, symbols may comprise any type, form or format of data. For example, this may include records, files, sectors, clusters, groupings and/or portions thereof. Furthermore, symbols may comprise words, bytes, bits, text, characters and/or the like. Symbol strings may comprise single or multiple symbols. Likewise, they may be fixed or variable in length.

For one particular embodiment, symbol strings may be coded in a particular or a predetermined order, although, again, this is merely an example embodiment and claimed subject matter is not limited in scope in this respect. Alternatively or in addition, rather than coding in an order, symbol strings may be coded in any order. In such an embodiment a symbol string code may be prefixed by some other code indicative of the particular symbol string, for example, although claimed subject matter is of course not limited in scope to this example embodiment. Likewise, for one particular embodiment, the approach employed may be switchable between modes, such as a mode in which symbol string codes are transmitted or stored in a predetermined order, and a mode in which the order is not predetermined, but in which, in this latter mode, some code representative of a corresponding symbol string is sent before or as part of a symbol string code.

If a symbol string includes repetitions of a symbol string, a symbol string code may include data which indicates presence of a run of occurrences of the symbol string. Storage or transmission of data indicative of a run of occurrences may typically be more efficient from a compression standpoint than sending such occurrences individually. In one particular embodiment, positions may be signaled by run length coding, but other coding methods are also possible instead or in addition, as described in more detail below. Likewise, coding may be context dependent at least in part. If a length of a set or grouping of data to be coded is known in advance, for example, it may be prefixed to a first symbol string code. Depending at least in part on the particulars of an embodiment, positions of a final symbol string may be determined without transmission or storage of additional information corresponding. to that particular symbol string, again as described in more detail below.

Furthermore, side or additional information about all or some symbol strings may also be included in a data code. In one particular embodiment, additional information relating to a particular symbol string may be sent at the end of or otherwise associated with a corresponding symbol string code.

Alternatively, additional information may be sent or stored after sending or storing symbol string codes. More generally, additional information could be provided at any time or in any manner so that a decoder is capable of associating that information with a corresponding symbol string. A list or table of symbol strings to be used may be predetermined or predefined, for example. Alternatively or in addition, it may be compiled based at least in part on symbol strings which occur in data to be compressed, for example.

After symbol string codes for a particular set or grouping of data have been stored or transmitted, an end code may be used. After positions of symbol strings present in a set of data, except a final symbol string, have been stored or communicated, positions of the final symbol string may, in at least some embodiments, be determined. Hence, an encoder may omit storing or communicating positions of such a final symbol string, as described in more detail hereinafter.

Likewise, embodiments covered by claimed subject matter include, for example, a computer program capable of implementing any such method, and/or a computer system capable of implementing such a method. Embodiments also include a hardware and/or software coder capable of carrying out a method as described below in combination with a hardware and/or software decoder capable of reconstructing an original set or grouping of data from a data code representing a compression of such data. These as well as many other embodiments are intended to be within the scope of claimed subject matter.

In at least some embodiments described, compression is lossless, although claimed subject matter is not limited in scope in this respect. For example, in some embodiments, a data code may include information on positions of those symbol strings contained within the data to be compressed.

In this particular context, any grouping, set or portion of associated data to be compressed is treated as an ordered sequence of characters or other symbols. If such data is representative of text, for example, individual symbols may comprise one or more text characters, but that is, of course, not essential. Many other symbols may also be represented. More generally, symbols may be presented by bytes or other sized groupings of data. It is also possible that longer or short portions of data could be used, which may or may not fit within a byte or digital word length, for example. If data is represented in binary form, a symbol could be represented, depending on the particular embodiment, as a single bit or multiple bits of fixed or variable length.

Data, such as stored as a file, a record or other unitary association of data, as one example, might be treated as a whole, or instead partitioned or divided into convenient lengths, long enough for symbol groupings, referred to here as symbol strings, to be coded with some amount of compression efficiency, but short enough to be conveniently processed. Various approaches are described in more detail below.

Initially, for example, in one particular embodiment, a list or table of symbol strings that may occur within a set of data is established. Added to this list might be an initial list of symbol strings based at least in part on a priori knowledge or information regarding statistics for the data. For example, for text, a common symbol string might comprise "ee", frequently occurring words such as "and" or "or", or a punctuation symbol followed by a blank, to provide some simple examples. Of course, claimed subject matter is not limited in scope to these examples or to this particular embodiment. Many possible variations are also intended to be included within the scope of claimed subject matter.

A particular set of data, as another example, might be examined before coding begins to identify symbols strings that occur commonly. Alternatively, or in addition, if partitioning is applied, these partitions, for example, may be handled separately or independently using an initial list of symbol strings. This initial list may have been determined, for example, at least in part from symbols strings which may have been found in earlier data partitions, for example.

Alternatively, symbol strings could be added as coding proceeds, as occurs in Lempel-Ziv-Welsh coding, as an example. However, in this embodiment example, coding symbol strings, as described below, is quite different from the approach used in LZW coding. In LZW, a symbol string is coded by substitution of another, longer symbol or string. For that reason, LZW may, at times, not compress sets of data and, in some cases, may produce longer sets of data. In contrast, embodiments in accordance with claimed subject matter will likely result in compression, as described in more detail hereinafter.

To compress a grouping or a set of data, a first symbol string may be selected from a list of available symbol strings. Occurrences of that string in the data are located. Positions of the first symbol string within the data are retained. This process is then repeated for additional symbol strings for the data so as to specify the set or grouping. Data comprising symbol strings may be processed in any order, although sequentially from beginning to end of the set or grouping of data may be one convenient approach.

Typically, coding is carried out by a hardware or software coder. In one possible embodiment, a coder may be arranged to transmit data, after being coded, across a communications channel to a decoder which may be arranged, in real time or otherwise, to use received coded data to reconstruct the set of data.

Figure 1:
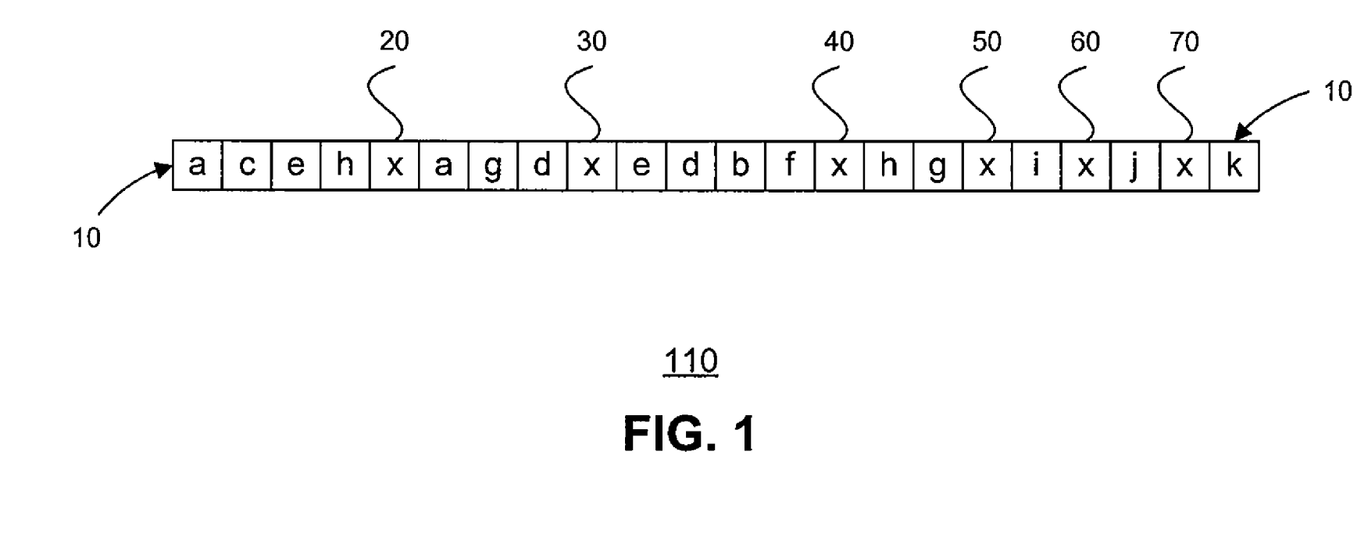
FIG. 1 is a schematic diagram illustrating one embodiment in accordance with claimed subject matter.

Again, claimed subject matter is not limited in scope to a particular embodiment. Therefore, the embodiments described previously or hereinafter are intended simply as examples for purposes of illustration. Many other approaches and/or embodiments are intended to be included within the scope of claimed subject matter other than these specific examples. Nonetheless, continuing with these examples, reference is now made to FIG. 1. FIG. 1 is a schematic diagram of one potential embodiment in accordance with claimed subject matter.

In the example of FIG. 1, one line of text is illustrated to represent a set or grouping of data. Likewise, a symbol string, here, the letter "x," will be processed in this example. Of course, claimed subject matter is not limited to this example embodiment or to any one particular embodiment. This example is simply an illustration for explanatory purposes. Many other potential embodiments are intended to be included within the scope of claimed subject matter.

Starting at a location, referred to here as "start," designated in FIG. 1 as 10, text data 110 is searched sequentially in this example. Of course, claimed subject matter is not limited to sequential searching, as mentioned previously, above. Nonetheless, if an occurrence of a selected symbol string, here, again, "x," is found, information about the occurrence, such as, in this example, its location, is retained, In the example shown, the first occurrence of the string "x" occurs in the $5^{st}$ position after start position 10, as is indicated by reference numeral 20. Symbol string "x" is again at position nine after the start, or four positions further on from the preceding one, as is indicated by reference numeral 30.

Continuing with the example, "x" occurs again five positions later, after the preceding one, as shown by reference numeral 40. Subsequent positional spacing is 3, 2, 2, as respectively shown by reference numerals 50, 60, 70.

Once text data 110 has been fully parsed in this way to an "end" position, here 100, a code representative of positions in the portion of the set of data is generated by storing or transmitting this code. In this particular embodiment, in effect, positions at which x does not occur are stored or signaled. In this context, this is referred to as run length coding. Here, "runs" of positions not containing x are coded.

In the simple example embodiment of FIG. 1, data comprised a line of text and the symbol string comprised a letter. In variants of this within the scope of claimed subject matter, occurrences of more lengthy and/or complex symbol strings may be sought. As described in more detail below, these may comprise symbol strings having a fixed, predefined form, or alternatively, may comprise symbol strings having flexibility, such as, in form, length, and/or composition, for example. The extent of flexibility may be predefined or it may be calculated with some dependence at least in part upon some characteristic or characteristics of the data. Some further example symbol strings are set out below.

- Any letter, symbol or character a, such as "x". This could in principle include a single symbol position.
- Any bigraph $a_1 a_2$, such as "st".
- Any combination $a_1 a_2 a_3$, such as "str".
- Any longer combination $a_1, a_2 a_3 \ldots a_n$, such as "st___ng" where the underscores represent single symbol positions.

After positions of a first symbol string have been determined, positions of a second symbol string in a list of possible or known symbol strings may be determined. Gradually, in this manner, a set of data may be coded. As coding proceeds, a coder may transmit to a decoder information about symbol strings that have been located, such as position(s), in real time for some embodiments. Alternatively, coded data may be stored locally as a compressed representation.

The example embodiment may be expressed in pseudo-code as follows:

```
For S = Symbol Strings
    Indicate positions of S in a set of data
End
```

As a further example, consider a short sequence S of 8 symbol strings S1 to S8. For purposes of illustration, symbol strings here comprise a fragment of text, although claimed subject matter is not limited in scope in this respect. Such fragments are short and, furthermore, symbol strings may not comprise text at all and still be within the scope of claimed subject matter. A space between the two words also comprises a symbol string in this example, as illustrated below:

S: 'the test'

| S1 | S2 | S3 | S4 | S5 | S6 | S7 | S8 |
|----|----|----|----|----|----|----|----|
| t  | h  | e  | 'space' | t | e | s | t |

In this example, positions of a symbol string may be indicated by any convenient approach. A convenient approach to communication or transmit positions is as plain numerals. A set of symbol strings are evaluated with respect to a set of data in some order. Suppose, for the purposes of illustration, as an example, symbol strings here have the order 'e' 't' 's' 'h' 'space', although, of course, claimed subject matter is not limited in scope to this example or to any particular example. Nonetheless, for this example, the following symbol strings may be communicated or stored as follows:

| 3 6 | 1 5 8 | 7 | 2 | 4 |
|-----|-------|---|---|---|
| Scan for e | Scan for t | Scan for s | Scan for h | Scan for 'space' |

In the above, 3 and 6 indicate the position of symbol string 'e'; 1, 5 and 8 indicate the position of 't' and so on.

For this particular embodiment, a technique is desired to indicate no additional information for a particular a symbol string is communicated or stored. One way of doing this may be to define a special symbol for End Of Group (EOG). This would give, for this example embodiment:

| 3 6 EOG | 1 5 8 EOG | 7 EOG | 2 EOG | 4 EOG |
|---------|-----------|-------|-------|-------|
| Scan for e | Scan for t | Scan for s | Scan for h | Scan for 'space' |

However, more efficient coding may be desired. For example, with eight positions, 3 bits per symbol string may be employed to communicate this by a conventional coding method, quite apart from communicating an EOG.

To improve compression efficiency, we can apply Run Length Coding (RLC) to the positions of successive symbol strings. Any form or type of coding to code the length of a run might be used and claimed subject matter is not limited to a particular form or type. For example, a Golomb coder, or a binary arithmetic coder might be employed, to provide a few examples. These coders may be employed, for example, to code a succession of 0's and 1's that indicate one or more positions in a set of data where a symbol string does not and does occur (or vice versa). Of course, these are simply examples and claimed subject matter is not limited in scope to such examples. Many other possible approaches to coding the length of runs are contemplated and included within the scope of claimed subject matter.

Nonetheless, continuing with this example, in such an embodiment the positions of a symbol string could be run length coded. In this case, for example, instead of coding 3 followed by 6 to indicate positions of symbol string 'e', one may code a 2 to indicate that 2 positions are skipped before the first occurrence of 'e', 2 to indicate that two further positions are skipped to get from position 3 to position 6 and so on:

| 2 2 EOG | 0 3 2 EOG | 6 EOG | 1 EOG | 3 EOG |
|---------|-----------|-------|-------|-------|
| Scan for e | Scan for t | Scan for s | Scan for h | Scan for 'space' |

This provides compression by involving the 6 symbols 0, 1, 2, 3, and 6 in addition to EOG, which is a smaller set to code than the 9 symbols 1 to 98 plus BOG.

However, compression may be improved still further by a method analogous to "significance switching." More specifically, here, for each successive symbol string that is coded, positions to be coded become fewer as more and more symbol strings become determined by position. This additional information regarding position may be employed to provide additional compression.

In the present example, as the positions of symbol string 'e' become known, for example, these positions may be omitted as possible positions for later symbol strings. In effect, for the purpose of coding, how many unknown positions are to be skipped is coded, rather than total positions to be skipped, thereby providing additional compression. Without Run Length Coding, in this example, this is:

| 0010 0100 | 10x0 1x01 | x0x0 xx1x | x1x0 xxxx | xxx1 xxxx |
|---|---|---|---|---|
| Scan for e | Scan for t | Scan for s | Scan for h | Scan for 'space' |

The symbol x here indicates a position that is already known and so does not have to be signaled. The total number of '0''s and '1''s is reduced, from 40 to 20, and as a Run Length Code this is further reduced:

| 2 2 EOG | 0 2 1 EOG | 2 EOG | 0 EOG | 0 EOG |
|---|---|---|---|---|
| Scan for e | Scan for t | Scan for s | Scan for h | Scan for 'space' |

In this particular embodiment, the number of different symbols used has been reduced even further, to 0, 1, 2, and EOG. To specify the positions of 'e', the RLC is the same because no positions are known beforehand. However in coding 't', positions containing 'e' may be omitted since they are already occupied, so these do not have to be counted in the RLC for the purpose of coding and/or decoding.

Furthermore, once the coder comes to the final symbol string to be coded, its positions may be determined without communicating or coding any additional information. More specifically, in this example embodiment, this symbol string occupies positions not previously signaled or coded. However, this assumes the length of the set of data being coded is known. If so, after EGG for is encountered, remaining symbol strings in this example are implicitly 'space' and the process may terminate without additional coding or communication. In the given example, therefore, assuming it is known that 'space' is the final symbol strings, additional compression may be obtained as follows:

| 2 2 EOG | 0 2 1 EOG | 2 EOG | 0 EOG | |
|---|---|---|---|---|
| Scan for e | Scan for t | Scan for s | Scan for h | Scan for 'space' |

However, it may also be desirable in some circumstances to employ a similar approach if the length of a set of data and/or number of symbol strings is not known. Various approaches are possible in situations where the length of a set of data being coded, for example, is not known and claimed subject matter is not limited in scope to a particular approach. For example, this might be handled by having a standard length. Alternately, length information may be prefixed to coded information. However, if multiple sets of data are being coded and most have the same length, to prefix length would be inefficient from a compression standpoint. Likewise, continuing with this notion, for a long communication of data, if a standard length is employed to sub-divide the data, variation from a standard length may be handled by communicating or coding a set of data at the end smaller than the standard length.

One method may include providing the total length of a data set before coding. If there is a standard partition length, the coder and decoder may determine how many partitions there are, and the length of final partition if it is less than the standard length, For example, if a set of data which is 102 symbol strings long is being coded and the standard length of a partition is 5, then 21 partitions are present with the final one having a length of 2. Again, as previously alluded to, the total length may be included in the data code in many ways and the examples given are not intended to be restrictive, claimed subject matter is intended to include these example approaches as well as other possible approaches.

Likewise, several approaches are also possible with respect to handling symbol strings. For example, as previously illustrated, a predetermined order of symbol strings may be employed. However, alternately, symbol strings may be ordered relative to their frequency of occurrence if known or capable of being determined or approximated. For example, using English simply as an example, this might have the following order: 'e' 't' 'a' 'n' 's' 'h' and so on. A "space" may be included in such order as its statistics indicate in a sample. Also, there may be symbol strings that do not occur, which may form an empty group to be signaled. With such an approach, both the coder and the decoder have an order of symbol strings. Accordingly, if a decoder receives an EOG, for example, it is able to determine the next appropriate symbol string.

Another approach may be to explicitly prefix a set of data, for example, with a symbol string. Likewise, a symbol string may alternately be post-fixed or otherwise embedded so that a decoder may make appropriate determinations from coded data. It is likewise possible that a system may employ two modes, one in which a predetermined order of symbol strings is communicated and another in which symbol strings are prefixed or otherwise embedded. These modes could occur in any order and mode switching may be indicated, in one example, by a special symbol used for that purpose.

In still another possible embodiment, a coder and decoder could adopt a method of constructing new symbol strings from symbol strings already received. This level of flexibility may permit an encoder to select or change symbol strings and modes of communication to improve compression. For example, it might well be the case that not all predefined symbol strings are used, in which case, to avoid signaling a large number of empty groups by repeating the EOG symbol, there might be a new symbol string which signals No More Groups, effectively meaning End of Data Set or End of Data, for example.

In many situations, side information might accompany a data set. For example, in the case of text, font, size, weight, color and/or style might comprise such side information. This may be communicated or coded any number of ways. For example, side information may be embedded with a run length, or inserted in coded data in any position so that a decoder may appropriately associate it with a symbol string. In one embodiment, it might be desirable to handle side information combined with a symbol string as a symbol string itself, hence forming additional groups. For example, an italic 'e' may form a separate symbol string from normal 'e', as one simple example. Likewise, in an embodiment, a special symbol may be employed to switch between different embedding styles or approaches, if desired.

Embodiments in accordance with claimed subject matter may be applied to coding of data of all types, including non-numeric data, such as symbolic data, for example, converted into numerical form by any convenient mapping prior to application of coding. As is noted, embodiments perform well for run length coding, although it will, of course, be understood that claimed subject matter is not limited to that application. It is intended that embodiments of claimed subject matter be applied to any one of a number of different types of data coding. Therefore, claimed subject matter is not intended to be limited in terms of the type of data to which it may be applied.

It will, of course, be understood that, although particular embodiments have just been described, the claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that if executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive.

Figure 2:
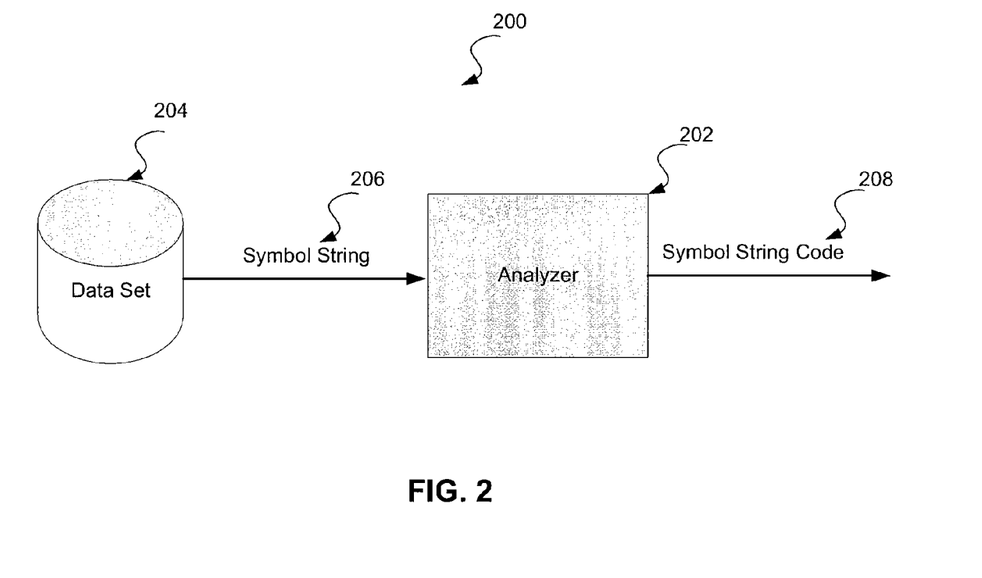
FIG. 2 illustrates an exemplary system.

FIG. 2 illustrates a system 200. System 200 includes an analyzer 202 connected to a Data Set 204. Analyzer 202 receives a symbol string 206 from the data set 204 and produces a symbol string code 208 therefrom. As discussed above, analyzer 202 can be a combination of hardware, software and/or firmware.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method of compressing a data set, comprising:
   selecting a symbol string, being one or more characters, that occurs within the data set;
   generating a symbol string code corresponding to respective positions of the symbol string within the data set;
   repeating the selecting a symbol string and the generating a symbol string code for any additional symbol strings that occur within the data set to produce any additional respective symbol string codes; and
   generating a compressed data code through combining the respective symbol string codes.

2. The method of claim 1, further comprising for at least one of the respective symbol string codes, coding respective positions of the symbol string using run length coding.

3. The method of claim 2, wherein the coding comprises Golomb coding.

4. The method of claim 2, wherein the coding comprises binary arithmetic coding.

5. The method of claim 1, further comprising terminating the symbol string code with an End of Group (EOG) symbol.

6. The method of claim 1, wherein the generating a symbol string code comprises determining distances between occurrences of the symbol string within the data set and generating the symbol string code based on the distances.

7. The method of claim 6, wherein the generating a symbol string code comprises determining the distances between occurrences of the symbol string within the data set when positions of previously coded symbol strings are omitted.

8. The method of claim 1, wherein the selecting a symbol string includes selecting a symbol string from a data set having a known length.

9. The method of claim 8, wherein the generating a symbol string code does not include generating a symbol string code for a last symbol string.

10. The method of claim 1, wherein the selecting a symbol string includes selecting a symbol string from a data set having a standard length.

11. The method of claim 1, further comprising prefixing a length of the data set to the compressed data code.

12. The method of claim 1, further comprising receiving an indication of a length of the data set before coding.

13. The method of claim 1, further comprising employing a predetermined order of the symbol strings.

14. The method of claim 13, further comprising ordering the symbol strings relative to their frequency of occurrence.

15. The method of claim 1, wherein the selecting a symbol string includes selecting a symbol string that has a fixed predefined form.

16. The method of claim 1, wherein the selecting a symbol string includes selecting a symbol string that has flexibility in form.

17. The method of claim 1, further comprising prefixing the symbol string code with the symbol string.

18. The method of claim 1, further comprising postfixing the symbol string code with the symbol string.

19. The method of claim 1, further comprising:
   generating the symbol string codes in a predetermined order during a first mode; and
   embedding the symbol strings in the compressed data code in a second mode.

20. The method of claim 1, further comprising interpreting a No More Groups signal as the end of the data set.

21. The method of claim 1, further comprising combining additional information about the symbol string with the symbol string to form a new symbol string.

22. The method of claim 1, further comprising storing the compressed data code or transmitting the compressed data code across a communications channel.

23. A system, comprising:
   an analyzer configured to:
     select a symbol string, being one or more characters, that occurs within a data set,
     generate a symbol string code corresponding to respective positions of the symbol string within the data set,
     repeat the select a symbol string and the generate a symbol string code for any additional symbol strings that occur within the data set to produce any additional respective symbol string codes, and
     generate a compressed data code through combining the respective symbol string codes.

24. A tangible computer-readable medium having stored thereon, computer-executable instructions that, in response to execution by a computing device, cause the computing device to perform a method comprising:

selecting a symbol string, being one or more characters, that occurs within a data set;

generating a symbol string code corresponding to respective positions of the symbol string within the data set;

repeating the selecting a symbol string and the generating a symbol string code for any additional symbol strings that occur within the data set to produce any additional respective symbol string codes; and generating a compressed data code through combining the respective symbol string codes.

25. A tangible computer-readable medium having instructions stored thereon, the instructions comprising:

instructions to select a symbol string, being one or more characters, that occurs within a data set;

instructions to generate a symbol string code corresponding to respective positions of the symbol string within the data set;

instructions to repeat the selecting a symbol string and the generating a symbol string code for additional symbol strings that occur within the data set to produce any additional respective symbol string codes; and instructions to generate a compressed data code through combining the respective symbol string codes.

26. A system comprising:

means for selecting a symbol string, being one or more characters, that occurs within a data set;

means for generating a symbol string code corresponding to respective positions of the symbol string within the data set;

means for repeating the selecting a symbol string and the generating a symbol string code for any additional symbol strings that occur within the data set to produce any additional respective symbol string codes; and means for generating a compressed data code through combining the respective symbol string codes.

27. A method comprising:

selecting a symbol string, being one or more characters, that occurs within a data set;

generating a symbol string code corresponding to respective positions of the symbol string within the data set through determining distances between occurrences of the symbol string within the data set;

repeating the selecting a symbol string and the generating a symbol string code for any additional symbol strings that occur within the data set to produce any additional respective symbol string codes; and generating a compressed data code through combining the respective symbol string codes.

28. The method of claim 27, wherein the generating a symbol string code further comprises determining the distances between occurrences of the symbol string within the data set in response to determining that positions of previously coded symbol strings are omitted.

* * * * *

UNITED STATES PATENT AND TRADEMARK OFFICE
CERTIFICATE OF CORRECTION

PATENT NO.       : 7,770,091 B2
APPLICATION NO.  : 11/425137
DATED            : August 3, 2010
INVENTOR(S)      : Donald Martin Monro It is certified that error appears in the above-identified patent and that said Letters Patent is hereby corrected as shown below:

Column 1, line 46: Replace "techmques" with --techniques--
Column 2, line 61: Replace "corresponding. to" with --corresponding to--
Column 4, line 61: Replace "5st" with --5th--

Signed and Sealed this
Twenty-fifth Day of October, 2011

David J. Kappos
*Director of the United States Patent and Trademark Office*